(12) United States Patent
Weigold

(10) Patent No.: US 7,504,598 B2
(45) Date of Patent: Mar. 17, 2009

(54) CONTROL DEVICE FOR AN ELECTRICAL APPLIANCE

(75) Inventor: Matthias Weigold, Bretten (DE)

(73) Assignee: E.G.O. Elektro-Geraetebau GmbH, Oberderingen (DE)

( * ) Notice: Subject to any disclaimer, the term of this patent is extended or adjusted under 35 U.S.C. 154(b) by 0 days.

(21) Appl. No.: 11/869,907

(22) Filed: Oct. 10, 2007

(65) Prior Publication Data
US 2008/0029369 A1 Feb. 7, 2008

Related U.S. Application Data

(63) Continuation of application No. PCT/EP2006/003338, filed on Apr. 12, 2006.

(30) Foreign Application Priority Data
Apr. 14, 2005 (DE) ........................ 10 2005 018 275

(51) Int. Cl.
*H03K 17/97* (2006.01)
(52) U.S. Cl. ............................ 200/61.45 R; 200/61.52; 200/61.45 M; 335/205; 335/207; 219/457.1; 338/32 H
(58) Field of Classification Search ................. 200/6 A, 200/61.52, 61.45 M, 61.45 R; 335/205–207; 219/457.1, 507; 338/12, 32 R, 32 H; 324/207.11–207.26
See application file for complete search history.

(56) References Cited

U.S. PATENT DOCUMENTS

| 2,803,720 | A |  | 8/1957 | Mason |
|---|---|---|---|---|
| 2,935,583 | A |  | 5/1960 | Howell |
| 2,985,734 | A |  | 5/1961 | Howell et al. |
| 3,711,672 | A | * | 1/1973 | Moreland et al. ........... 219/625 |
| 4,158,216 | A |  | 6/1979 | Bigelow |

(Continued)

FOREIGN PATENT DOCUMENTS

DE 1590371 6/1970

(Continued)

OTHER PUBLICATIONS

International Search Report from PCT/EP2006/003338, dated Sep. 19, 2006.

(Continued)

*Primary Examiner*—Ramon M Barrera
(74) *Attorney, Agent, or Firm*—Alston & Bird LLP

(57) ABSTRACT

An operator control device for an electric heating apparatus comprises a control element, which rotatably and removably rests on a mounting surface and is held by a magnetic retaining force. The control element has a bottom side facing the mounting surface while the mounting surface has a planar top side facing the control element. The bottom side is embodied in a flat manner in a first sub-area to keep the control element in a stable basic position, an effect that is supported by the magnetic retaining force. Said first sub-area is surrounded by an adjacent second sub-area that encompasses a receding curvature such that the control element can be tilted from the basic position while the contact to the mounting surface is maintained. Detection sensors are provided for detecting the position of the control element in the basic position or another position in order to trigger a control function.

15 Claims, 4 Drawing Sheets

U.S. PATENT DOCUMENTS

| | | | | |
|---|---|---|---|---|
| 4,233,593 | A | * | 11/1980 | Bigelow ........................ 341/15 |
| 4,317,016 | A | * | 2/1982 | Ito ............................... 219/622 |
| 4,812,804 | A | * | 3/1989 | Masaki ........................ 338/200 |
| 4,983,812 | A | * | 1/1991 | Worrall et al. ............ 219/445.1 |
| 5,373,125 | A | * | 12/1994 | Ford et al. ................ 200/61.52 |
| 5,646,587 | A | | 7/1997 | Miyazawa et al. |
| 5,920,131 | A | | 7/1999 | Platt et al. |
| 5,959,863 | A | | 9/1999 | Hoyt et al. |
| 6,020,987 | A | | 2/2000 | Baumann et al. |
| 6,153,837 | A | | 11/2000 | Garcia et al. |
| 6,294,906 | B1 | | 9/2001 | Kuechler |
| 6,498,326 | B1 | | 12/2002 | Knappe |
| 6,812,435 | B2 | | 11/2004 | Schilling |
| 6,838,785 | B2 | | 1/2005 | Schilling |
| 6,966,781 | B1 | | 11/2005 | Bullinger et al. |
| 7,069,090 | B2 | | 6/2006 | Huffington et al. |
| 2007/0181410 | A1 | | 8/2007 | Baier |

FOREIGN PATENT DOCUMENTS

| | | |
|---|---|---|
| DE | 8535821 | 2/1986 |
| DE | 4432399 | 3/1996 |
| DE | 100 35 592 A1 | 1/2002 |
| DE | 10212953 | 10/2003 |
| DE | 103 30 912 A1 | 2/2005 |

OTHER PUBLICATIONS

German Search Report for German Application No. 10 2005 018 275.5.

* cited by examiner

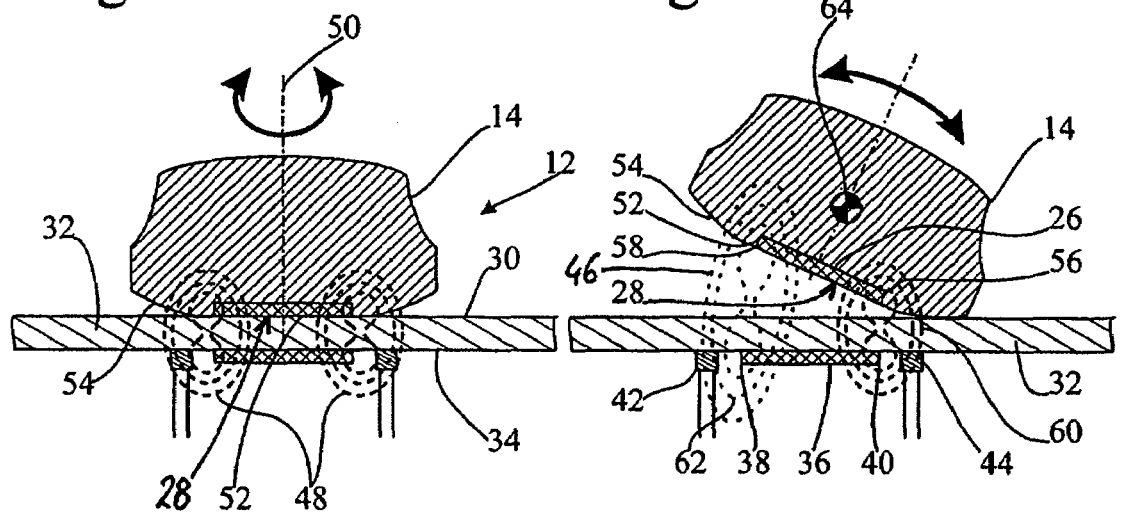
Fig. 3
Fig. 4
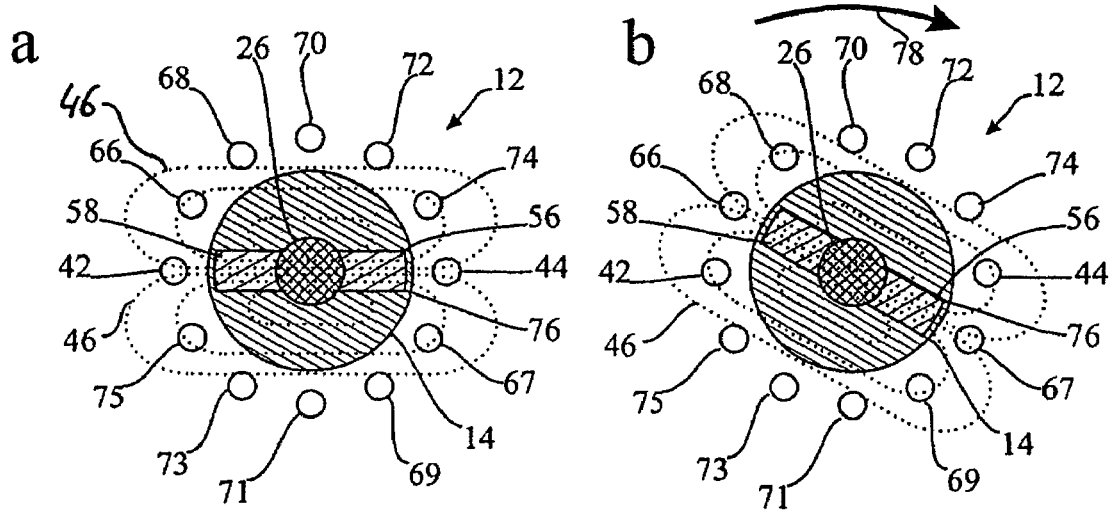
Fig. 5

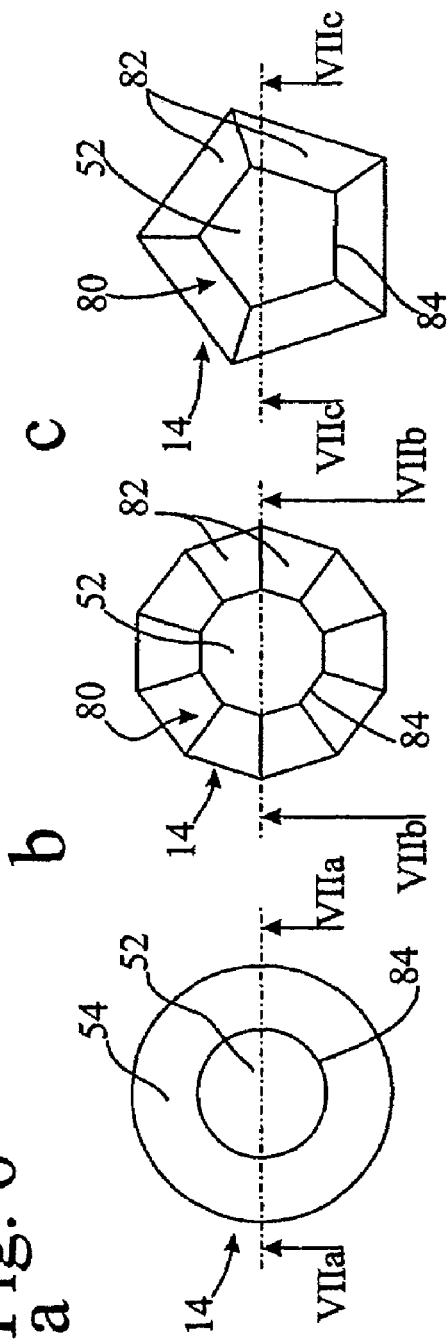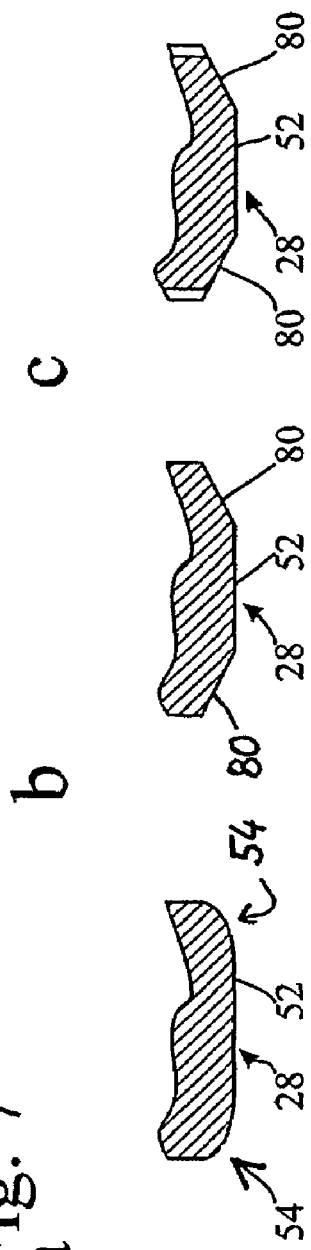

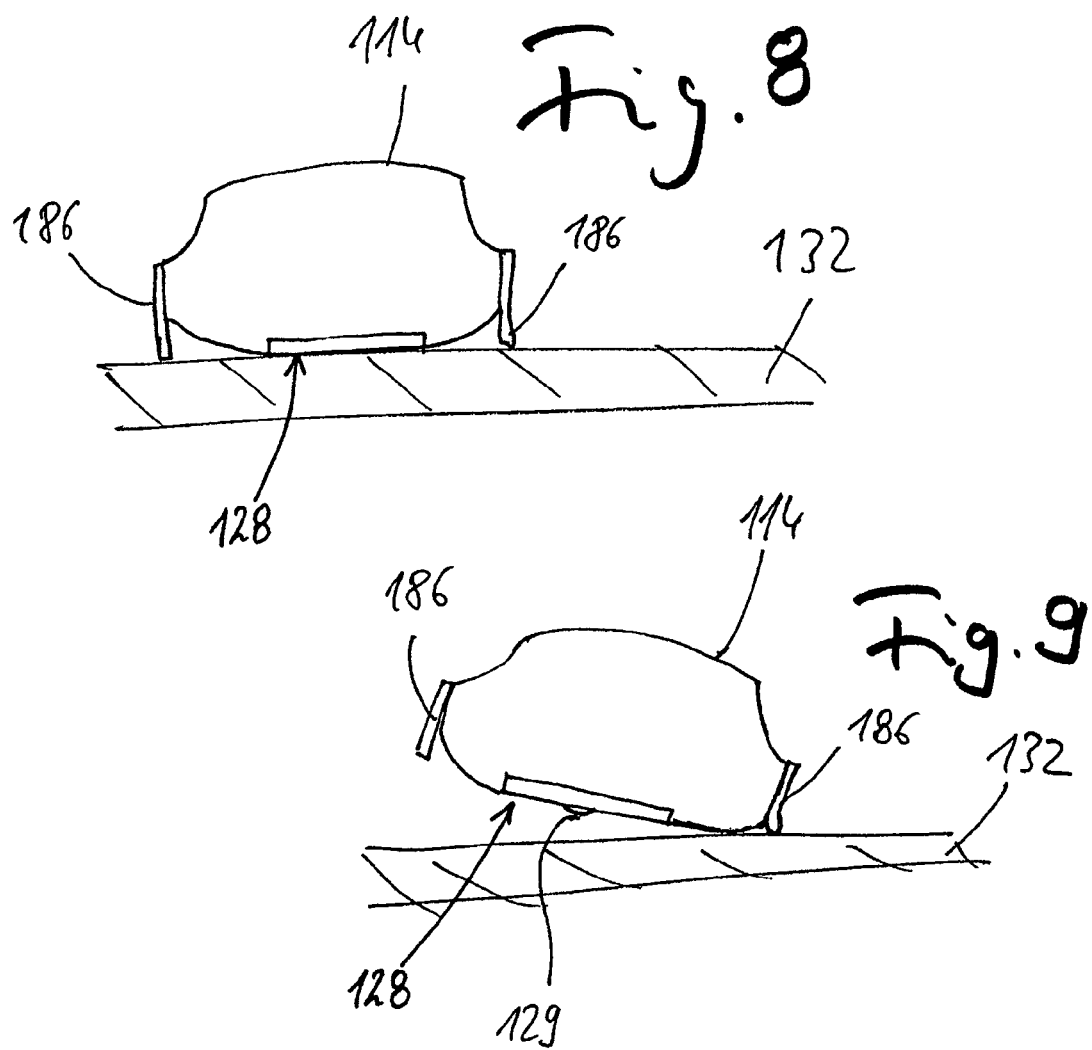

CONTROL DEVICE FOR AN ELECTRICAL APPLIANCE

CROSS REFERENCE TO RELATED APPLICATIONS

This application is a continuation of PCT/EP2006/003338, filed Apr. 12, 2006, which in turn claims priority to DE 10 2005 018 275.5, filed on Apr. 14, 2005, the contents of both of which are incorporated by reference.

FIELD OF APPLICATION

The invention relates to a control device for an electrical appliance, preferably an electrical heating appliance.

BACKGROUND

A control device for an electrical heating appliance is known from U.S. Pat. No. 6,498,326 A. The latter describes an arrangement for the control of electrically controllable devices, particularly electric cookers, in which a control element comes to rest in movable and removable manner on a substrate, which can for example be the surface of a glass ceramic hob. Within the control element and below the glass ceramic hob are in each case fitted permanent magnets, which are mutually oriented in such a way that they mutually attract and as a result the control element is held on the glass ceramic hob. Sensors are also fitted beneath the glass ceramic hob surface and detect a magnetic field strength. If the control element is displaced parallel to the glass ceramic hob surface, the resulting change to the magnetic field lines circulating through a plurality of sensors is recorded by said sensors, so that a switching process can be triggered. A similar control device is also known from U.S. Pat. No. 5,920,131 A.

Therefore the problem of the invention is to provide a control device of the aforementioned type, which permits reproducible switching positions of the control element and also a plurality of different triggering movements.

BRIEF DESCRIPTION OF THE DRAWINGS

Embodiments of the invention are described hereinafter relative to the attached diagrammatic drawings, wherein show:

FIG. 3 illustrate a sectional side view of the control device with the control element mounted on the hob;

FIG. 4 illustrates a sectional side view of the control device with the control element tilted on the hob;

FIGS. 5a and 5b illustrate sectional plan views of the control device in different rotary positions;

FIGS. 6a to 6c illustrate views from below of the control element with differently designed surface areas;

FIGS. 7a to 7c illustrate sectional, lateral detail views of the undersides of the control elements along section lines VIIa-VIIa, VIIb-VIIb and VIIc-VIIc in FIGS. 6a, 6b and 6c, and FIGS. 8 and 9 illustrate a variant of the representations of FIGS. 3 and 4.

DETAILED DESCRIPTION OF THE DRAWINGS

Figure 1:
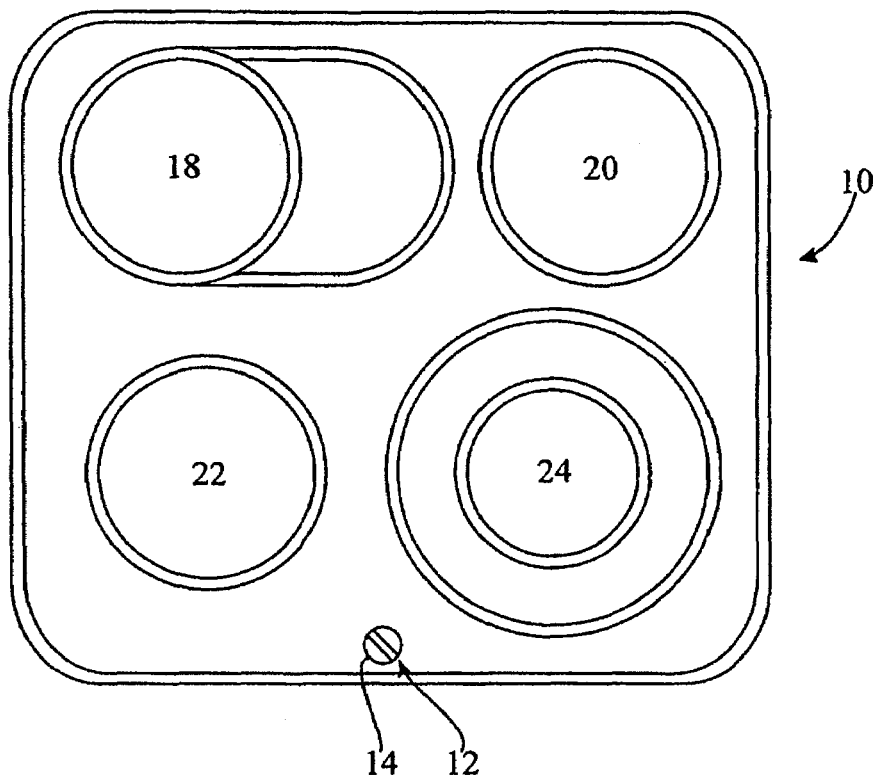
FIG. 1 illustrates a plan view of a hob with the provision of the control device in the marginal area of the hob.

This problem is solved by a control device having the features of claim 1 and a slightly modified control device having the features of claim 3. Advantageous and preferred developments of the invention form the subject matter of the further claims and are explained in greater detail hereinafter. The features of the control device described hereinafter largely apply to both constructions and are consequently only described once, but this does not restrict their general validity. By express reference the wording of the claims is made into part of the content of the description.

The control device has a control element, which can be fixed in a movable and removable manner to a mounting surface by means of a retaining force. Towards the mounting surface, the control element has a control element underside and towards the control element the mounting surface has a mounting surface top side.

According to a first embodiment of the invention, the control element underside in a first surface area is constructed in a corresponding manner to the planar mounting surface top side for a stable position of the control element as the stable basic position, the retaining force assisting in stabilizing the stable basic position. According to the invention, the first surface area is surrounded by a second surface area, which has a convexity or curvature diverging from the path of the first surface area. It retreats from the mounting surface top side in such a way that the control element can be tilted from the basic position in the case of permanent contact with respect to or engagement on the mounting surface. Detection means for detecting the position of the control element in the basic position or some other position and for triggering a control function are provided. As a result of the different geometrical design of the surface areas the control device can be transferred or tilted from a first basic position relative to the mounting surface top side into at least one second position relative to the mounting surface top side.

According to a second embodiment of the invention, the control element underside is planar or flat and the mounting surface top side is constructed in a first surface area in correspondence to the control element underside for a stable position of the control element as the stable basic position. Here again, the retaining force assists in stabilizing the stable basic position. Once again the first surface area is surrounded by a second surface area, which has a convexity or curvature diverging from the path of the first surface area. It retreats from the control element underside in such a way that the control element can be tilted from the basic position in the case of permanent contact towards the mounting surface. There are fundamentally similar detection means for detecting the control element position in the basic position or some other position and for triggering a control function. Through the different geometrical design of the surface areas, here again the control device can be transferred from a first basic position relative to the mounting surface top side into at least one second position relative to the mounting surface top side.

In brief, either the mounting surface top side is planar and the control element underside is slightly convex or is surrounded by the second retreating surface area or vice versa. When used in hobs, the first embodiment is preferred, because then a planar glass ceramic hob plate can be used.

With the facing side the first surface area forms a contact surface designed in such a way that the control element in its first, position-stable basic position is largely immovably located on the mounting surface top side. Thus, the vector of the weight force acting in the centre of gravity of the control element crosses the contact surface. Through tilting, the control element is transferred from its first basic position into a second, unstable position in which the second surface area contacts the mounting surface top side. In said second position the vector of the weight force does not intersect the contact surface, so that the control element moves back into its first basic position as soon as the force which has caused the tilting movement of the control element no longer has an effect. The automatic moving back of the control element from its second position into its first position corresponds, for example, to the return movement of a pushbutton.

The detection means for detecting the position of the control element are able to establish whether the control element engages on the mounting surface top side or the position in which the control element is located. Thus, the placing and removal of the control element on and from the mounting surface top side can for example be used for switching on and off the electrical appliance. The tilting of the control element can, on the one hand, be used for producing stepwise switching processes, in that the control element tilting process is generally used for triggering a control function. On the other hand, the duration of control element tilting can be recorded by the detection means so that a stepless switching process can be triggered as a function of the duration of tilting, which is similar the operation of certain types of dimmer switches. It is also possible for the control element to have the function of a rotary or sliding controller in addition to the toggle switch function.

In one embodiment of the invention, the control element underside or the mounting surface top side is planar and the first surface area of the other side is also planar. This leads to two corresponding, parallel, planar surfaces permitting a stable mounting of the control element.

In another embodiment of the invention, the second surface area is curved back in rounded manner from the other side and is preferably uniformly rounded. As a result, the tilting of the control element takes place through an acting force which is not the weight force of the control element, in a non-spontaneous, abrupt manner. Instead, the control element rolls over the second surface area. In the case of straight surfaces, the tilting movement becomes easier to control. It is alternatively possible to have an angling with an edge corresponding to an exact and significant switching point.

In another embodiment of the invention, the transition between the first surface area and the second surface area has a discontinuous course or step. An operator wishing to trigger a control function using the control element can, as a result of the step or discontinuous course, detect that the control element has adequately tilted, because the operator perceives a type of snapping.

In another embodiment of the invention, the mounting surface top side is planar and the control element underside has the first surface area and second surface area. This development makes it possible for the mounting surface top side to be planar and flat, preferably the top side of a glass ceramic hob, to avoid disturbing unevennesses on the top of the appliance. Consequently, tiltability is only achieved through the control element.

In another embodiment of the invention, the first surface area is circular and the second surface area constructed in the manner of a spherical cup-shaped ring, the first surface area passing directly and advantageously uniformly along the annulus into the second surface area. The circular, first surface area and the direct transition into the second surface area make the alignment of the control element with respect to the surface and the detection means unimportant. It is also unimportant on what plane of the control element and in which direction of the control element tilting has to take place for triggering a control function.

In another embodiment of the invention, the first surface area is polygonal, preferably equilateral or uniform and the second surface area is constructed with extended, prism-like partial faces, with the first surface area passing along the outer edge of the polygon directly into the second surface area. The polygonal design of the first surface area permits a clearly defined tilting of the control element in several directions on a plane, so that at least two different switching processes can be triggered. The possible number of different switching processes corresponds at least to the number of edges of the first surface area.

In another embodiment of the invention, the retaining force is gravity. This permits very low mechanical and production costs, because the control element can be made in one piece, for example in an injection moulding process. Further attachment parts on the control element are not absolutely necessary for the retaining force.

In another embodiment of the invention, a stabilizing device is provided for producing the retaining force, preferably in contactless manner, particularly by magnetic force. On one of the two sides of the control element underside or the mounting surface top side can be provided an active magnet and on the other side magnetic material or a second active magnet. The active magnets can be permanent magnets or coils. Through the provision of a magnet, either on the control element underside or the mounting surface top side and a corresponding counterpart on the in each case other side, the control element is fixed in position on the mounting surface top side. If the active magnet is placed on the control element underside, it is also possible to have an easy mounting in the case of nonuse of the control elements and the electrical appliance on any surface that can be magnetized, for example, on a refrigerator door.

In a further embodiment of the invention, the detection means operate in contactless manner, preferably by magnetic force or a magnetic field. In particular, in the control element there is provided an active magnet and below the mounting surface there are provided magnetic field sensors for detecting the change to the magnetic field in the control element as a result of its tilting, particularly out of the basic position. The contactless operating detection means are preferably Hall sensors. The latter can be both analog and/or digital and can be equipped with programmable or fixed characteristics. For evaluating the Hall sensor signals it is possible to have an electronic control as part of the detection means.

The tilting of the control element produces a gap formed at an angle between the mounting surface top side and the control element underside. The magnet located on the control element underside has different spacings at its poles with respect to the magnetic field sensors. These differences in the spacings lead to differences in the magnetic fields and are also detected by the sensors for using them for example for bringing about a switching process.

Preferably the magnetic field sensors are arranged in pairwise facing manner beneath the mounting surface, where in each case a magnetic field sensor is located in an area of the mounting surface adjacent to one of the poles of the magnet in the control element.

Further magnetic field sensors can be distributed around a point beneath the control element retaining surface. Advantageously, the sensors are arranged in circular manner. However, it is also conceivable to arrange the sensors in other geometrical configurations. Several magnetic field sensors arranged around the control element contact point permit the easy detection of different tilting directions of said control element. This also makes it possible to perceive the twisting or turning of the control element on the mounting surface and with an approximate resolution of the sensors. The turning action can be used, for example, for setting different switching stages of an electrical heating appliance. The electrical appliance can have a further detection device for detecting a rotary movement of the control element and for triggering a control function. Preferably, said detection device has further magnetic field sensors on or beneath the mounting surface and they cooperate with one or more magnets on or in the control element. Thus, the control element can be used as a rotary switch. The field lines of the magnet located in the control element can for example have an increased influence range through the provision of a sheet metal strip. For this purpose, the sheet metal strip should be parallel and congruent to a line linking the two poles of the magnet in or on the control element.

In another embodiment of the invention, the detection means magnet is the stabilizing device magnet. Apart from the possibility of economizing at least one magnet in this way, said design also leads to there being no undesired overlap of the magnetic field lines, which can lead to falsifications of the field lines to be detected.

In another embodiment of the invention, the control element can be tilted in several directions, preferably by a force-guided tilting movement. The force for the tilting movement is required in order to overcome the force of attraction of the magnet on its counterpart. Preferably, the magnetic force is low, but reliably holds the control element in the basic position. It should at least be possible to overcome it through limited force expenditure on the part of an operator.

In a further embodiment of the invention, the control element has a magnet at a higher point and two further, spaced magnets that are provided on or beneath the mounting surface. They have a spacing from the point at which the control element is placed on the mounting surface and during a tilting movement of the magnet in the control element they approach a point between the two magnets on or beneath the mounting surface. The magnet in the control element and the magnets on or beneath the mounting surface repel one another. Consequently the tilted control element is assisted from the like poles of the magnets directed towards one another during its movement from tilting into the stable basic position or along a stabilizing direction.

As an alternative to the detection of the rotation by magnetic force, optical detection is possible and for this purpose a sensor can be provided, advantageously beneath the mounting surface. With it cooperates an annular sensor trigger, which is placed on the underside of the control element and has a sequence of trigger areas and intermediate areas. Between the sensor and the sensor trigger, rotation takes place in the outward and return directions and this is detected by the sensor. Such an arrangement is known from DE 10330912 A1, to which express incorporation by reference is made.

For the better subdivision of a rotary movement into individual stages, particularly on setting power stages, a magnetic locking device can be provided, and by means of magnetic force or cooperating magnets, brings about a subdivision of the rotary movement into individual locking stages. Normally, such locking devices are mechanical. They can have, for example, a five or multiple-armed metal star with magnet, which cooperates with a corresponding number of magnets on the other side. The advantage of a magnetic locking device is that a closed mounting surface can be provided. In particular, such a magnetic locking device can bring about or assist with a clearly defined, prescribed tilting of the control element. Such a magnetic locking device is for example known from U.S. Pat. No. 5,920,131 A, to which express incorporation by reference is made.

Apart from applications for power control or the control of electrical cooking appliances, such as for example hobs, particularly with hob plates, which form the mounting surface, a number of other possibilities exist. Thus, safe keys can be constructed according to this principle. As a result of the rotation and tilting movements, a relatively complicated overall combination can be predetermined and is difficult to establish by trial and error. A dimmer circuit for lamps is also possible. A specific lamp can be selected as a result of the tilting movement. The brightness can be adjusted through the rotary movement. Finally, numerous other uses are conceivable, in which the control unit is essentially located behind a closed surface.

These and further features can be gathered from the claims, description and drawings and the individual features, both singly and in the form of subcombinations, and can be implemented in an embodiment of the invention and in other fields and can represent advantageous, independently protectable constructions for which protection is claimed here. The subdivision of the application into individual sections and the subheadings in no way restricts the general validity of the statement made thereunder.

FIG. 1 shows a hob 10 with a possible arrangement of the control device 12 in a marginal area of said hob 10. A shown in FIG. 2, a magnet 26 is provided on the underside 28 of control element 14. The top side 30 of a glass ceramic plate 32 faces or rests on underside 28. A magnet 36 is also placed on underside 34 of glass ceramic plate 32. Both in the left-hand marginal area 38 and also in the right-hand marginal area 40 of magnet 36 is provided a corresponding left-hand magnetic field sensor 42 and right-hand magnetic field sensor 44. To improve rotatability whilst simultaneously maintaining centring, the underside 28 or magnet 26 can have a slight convexity or centring elevation.

Figure 2:
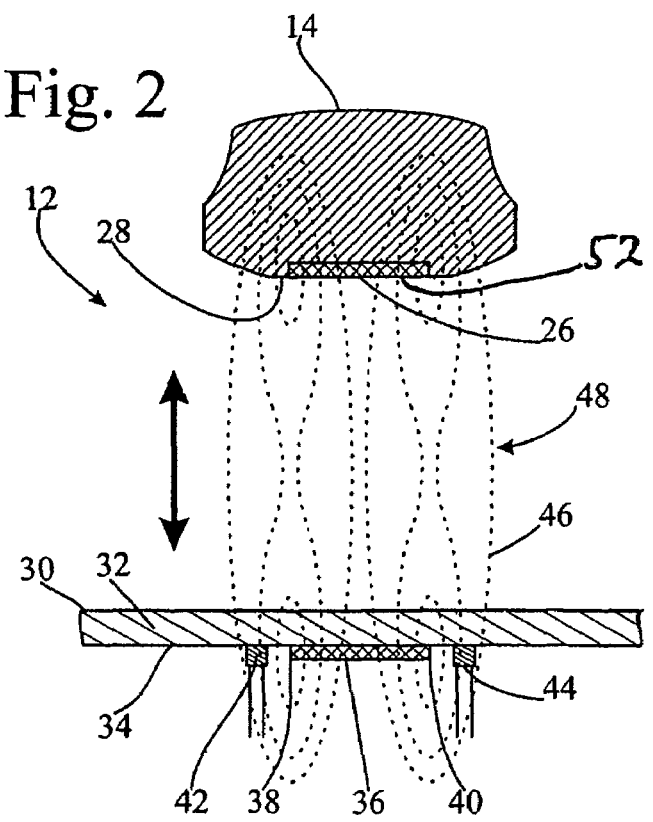
FIG. 2 illustrates a sectional side view of the control device with the control element raised from the hob.

In FIG. 2 the control element 14 is moved up to the glass ceramic plate 32 to the extent that the magnetic field lines 46 of magnets 26, 36 just overlap. Magnets 26, 36 form a common magnetic field 48, which is stronger than the individual magnetic fields of magnets 26, 36. The nearer control element 14 is brought to glass ceramic plate 32, the stronger the magnetic field 48 becomes. This change is recorded by magnetic field sensors 42, 44. If the control element 14 and glass ceramic plate 32 have dropped below a specific mutual spacing, an electronic circuit (not shown) electrically connected to magnetic field sensors 42, 44 triggers a switching process. Thus, control element 14 can be used, for example, for a master switch function of the electrical appliance by the approach to and removal from the glass ceramic hob.

In FIG. 3 the underside 28 of control element 14 engages on the top side 30 of glass ceramic plate 32. In this position shown it is possible to rotate control element 14 about axis 50. The rotary movement of control element 14 inter alia changes the mutual positioning of the poles of magnets 26, 36, so that the strength of the magnetic field 48 is reduced at specific points. The change to the magnetic field 48 can then be detected and used for the replacement of the function of a conventional mechanical rotary switch by the control device.

As can be gathered from FIG. 3, the underside 28 of control element 14 is divided up into two differently designed areas. First, the planar area 52 on which the control element 14 rests on the glass ceramic plate in the position shown in FIG. 3 and secondly there is a curved area 54. The curvature of area 54 starting from the planar area 52 runs in a direction away from glass ceramic plate 32.

The convex shape of area 54 is required for allowing a tilting of control element 14 according to FIG. 4. The tilting of the control element 14 leads to the poles 56, 40 of magnets 26, 36 remaining in a roughly unchanged mutual position. Compared with the untilted control element state, their joint magnetic field remains roughly the same.

However, the poles 38, 58 of magnets 26, 36 move clearly apart through the tilting of control element 14 and as a result the joint magnetic field 62 of magnets 26, 36 in the vicinity of poles 38, 58 is weakened. Magnetic field sensor 44 detects the field strength of magnetic field 60 and magnetic field sensor 42 detects the field strength of magnetic field 62. The differences in the magnetic field strengths of magnetic fields 60, 62 can be established by means of evaluation electronics (not shown), which trigger a switching process corresponding to the differences in the field strengths. It is also conceivable to have a multistage switching process as a function of different opening angles or tilt positions between the underside of control element 28 and the mounting surface top side 30.

Control element 14 can be moved by an operator into the tilted position. If the operator again releases control element 14 in its tilted position, in much the same way as a pushbutton, the control element again moves into its untilted, stable basic position relative to the glass ceramic plate 32 of FIG. 3. This takes place as a result of the convexity of area 54 and the path of the vector of the weight force of control element 14, which acts in the centre of gravity 64. Through the tilting of control element 14, the vector of the weight force of control element 14 does not pass through the contact surface between control element 14 and glass ceramic plate 32.

FIGS. 5a and 5b show sectional plan views of control device 12, control element 14 in each case being oriented in a different direction. In circular manner around the control element 14 there are provided pair-wise facing magnetic field sensors 42, 44, 66, 67, 68, 69, 701, 71, 72, 73, 74, 75.

Apart from magnet 26, there is also a sheet metal strip 76 in the interior of control element 14 running parallel to a not shown connecting line of the two poles 56, 58 of magnet 26. Sheet metal strip 76 is used for a planned orientation and increase in the extent of the magnetic field lines 46. It could also be multi-armed, for example five-armed for attaining the action of the aforementioned star of the magnetic locking device. Here again there can be a planned orientation and increase in the extent of the magnetic field lines for the cooperation with correspondingly arranged magnets.

In FIG. 5a, the control element 14 and therefore also the connecting line of poles 56, 58 of magnet 26 is oriented in such a way that it is congruent to the connecting line of magnetic field sensors 42, 44. In FIG. 5b, control element 14 is in exemplified manner rotated by approximately 30° corresponding to the direction shown by arrow 78. Thus, the connecting line of the poles 56, 58 of magnet 26 are congruent to the connecting line of magnetic field sensors 66, 67. Through the rotation of control element 14 and the resulting magnetic field rotation, as a function of the position of control element 14, different strong magnetic fields are detected by different magnetic field sensors. On the basis of these differences, a switching signal can be triggered, for example, by means of an evaluation electronics well known in the art (not shown).

FIGS. 6a, 6b and 6c show different implementation possibilities for the underside 28 of a control element 14. FIG. 6a shows the underside 28 subdivided into an inner area 52 and a ring-like, outer area 54. The two areas are circular and oriented concentric to one another. However, it is also possible for the areas 52 and 54 not to be circular and instead polygonal, for example decagonal, as shown in FIG. 6b, or pentagonal as shown in FIG. 6c. The polygonal design of control elements 14 also has an inner area 54, which is surrounded by an outer area 80. The outer areas 80 are, corresponding to the number of edges 84 of control element 14, subdivided into different facets 82. The inner area 52 and outer area 80 are preferably arranged in such a way that all the facets 82 of a polygonal control element 14 are of the same size. The number of edges also corresponds to the minimum number of possible tilting movements of control elements 14 in order to trigger a clearly defined switching process.

Possible differing design possibilities for the outer area 54, 80 of control element 14 are shown in side view and exemplified manner in FIGS. 7a, 7b and 7c. In all the design possibilities the inner area 54 is the same to the extent that it is planar and, if it forms a contact surface with a bearing surface 32, is parallel to the latter, cf. FIGS. 2, 3 and 4.

FIG. 7a shows a curved course of outer area 54, 80 of a circular control element 14 according to FIGS. 6a or 6b. It points away from the inner area 52 of control element 14 and a not shown bearing surface with which the inner area 52 forms a contact surface. Corresponding to section line VIIb-VIIb in FIG. 6b, FIG. 7a shows area 80 at a contact point of two facets 82.

Another possible geometry of outer area 54, 80 of a circular or polygonal control element 14 is shown in FIG. 7b. The represented path is planar and points away from the inner area 52 of control element 14 and a not shown bearing surface with which said inner area 52 forms a contact surface.

FIG. 7c is a detail view of a pentagonal control element 14 sectioned according to line VIIc-VIIc in FIG. 6c. It is possible to see the sloping, outer area 80 of pentagonal control element 14 in an inner area of its facets 82, in the same way as it can be designed for any other polygonal control element 14.

FIGS. 8 and 9 show a variant of FIGS. 3 and 4. Here on the underside 128 of control element 114 and namely on the outer edge is provided a type of downwardly hanging or downwardly extending, elastic skirt 186, which can be in the form of an externally circumferential rubber band or the like. Alternatively, it can be constructed more for a evading lateral movement than for compression purposes. Thus, even a type of hinge function is conceivable. In the normal, upright position according to FIG. 8, the skirt 186 extends to just in front of the top of glass ceramic plate 132, so that no friction occurs during rotation. Alternatively, the skirt 186 can just extend onto the glass ceramic plate 132, so that friction is very low.

As a result of said skirt 186, there is a certain stability against tilting or an increased force is necessary for tilting the control element 132, but this can easily be applied by an operator. To this end the skirt 186 can be relatively thin or made from a corresponding elastic material. With the control element 132 tilted to the right, FIG. 9 shows how here the skirt 186 is compressed or bent to the side.

Through the special shaping of such a skirt it is possible to predetermined a specific tilting direction. Thus, a bending or compressing of the skirt is only possible in certain directions. Another advantage of such a skirt is that the lateral elevation of the edge above the bearing surface cannot be seen, which gives a more pleasing appearance.

FIG. 9 also shows a centring convexity 129 on underside 128. It is fitted centrally and is used for easier, point accurate rotation. The centring convexity 129 can for example be in the form of a small material application or a stuck-on element.

The invention claimed is:

1. A control device for an electrical appliance, said control device having a control element with a control element underside having a first surface area and a second surface area, said control element being constructed for resting in movable and removable manner with said control element underside on a mounting surface having a planar mounting surface top side by means of a retaining force, wherein said control element underside in said first surface area is constructed corresponding to said planar mounting surface top side for a stable position of said control element in a tilt-stable basic position, said retaining force assisting said basic position, said first surface area being surrounded by said second surface area having a convexity diverging from a course of said first surface area and retreating from said mounting surface top side in such a way that said control element is tiltable away from said basic position in case of engagement towards said mounting surface into a tilted position, detection means being provided for detecting said position of said control element in said basic position or in said tilted position and for triggering a control function.

2. The control device according to claim 1, wherein said control element underside is substantially planar in said first surface area.

3. A control device for an electrical appliance, said control device having a control element with a planar control element underside having a first surface area and a second surface area, said control element being constructed for resting in movable and removable manner with said control element underside on a mounting surface having a mounting surface top side by means of a retaining force, wherein said mounting surface top side in said first surface area is constructed corresponding to said planar control element underside for a stable position of said control element in a tilt-stable basic position, said retaining force assisting said basic position, said first surface area being surrounded by said second surface area having a curvature diverging from a course of said first surface area and retreating from said control element underside in such a way that said control element is tiltable away from said basic position in case of engagement towards said mounting surface into a tilted position, detection means being provided for detecting said position of said control element in said basic position or said tilted position and for triggering a control function.

4. The control device according to claim 3, wherein said mounting surface top side is substantially planar in said first surface area.

5. The control device according to one claim 1, wherein said second surface area is curved back in rounded manner away from said first surface area.

6. The control device according to claim 1, wherein a transition between said first surface area and said second surface area has a step and is formed in discontinuous manner.

7. The control device according to claim 1, wherein said first surface area is annular and said second surface area is constructed in the manner of a spherical cap-shaped ring, said first surface area passing along an annulus directly into said second surface area.

8. The control device according to claim 1, wherein said first surface area is polygonal and said second surface area is constructed with extended, prism-like partial faces, said first surface area passing along said outer edges of said polygon directly into said second surface area.

9. The control device according to claim 1, wherein a stabilizing device for producing said retaining force in contactless manner by a magnetic force is provided.

10. The control device according to claim 1, wherein said detection means are constructed for contactless detection by magnetic force or a magnetic field, wherein an active magnet is located in said control element and under said mounting surface are provided magnetic field sensors for detecting a change in said magnetic field in said control element as a result of said tilting of said control element.

11. The control device according to claim 10, wherein further magnetic field sensors are distributed beneath said mounting surface around a point on which said control element is located.

12. The control device according to claim 9, wherein said detection means magnet is said magnet for said stabilizing device.

13. The control device according to claim 1, wherein said control element is tiltable in several directions.

14. The control device according to claim 1, wherein a further detection device for detecting a rotary movement of said control element and for triggering a further control function is provided, wherein said further detection device has further magnetic field sensors beneath said mounting surface, which cooperate with one or more magnets of said control element.

15. The control device according to claim 1, wherein a further detection device for detecting a rotary movement of said control element and for triggering a further control function is provided, and being constructed for contactless detection.

* * * * *